(12) United States Patent
Haq

(10) Patent No.: US 6,245,677 B1
(45) Date of Patent: Jun. 12, 2001

(54) BACKSIDE CHEMICAL ETCHING AND POLISHING

(76) Inventor: Noor Haq, 21450 Mt. Eden Ct., Saratoga, CA (US) 95070-5302

( * ) Notice: Subject to any disclaimer, the term of this patent is extended or adjusted under 35 U.S.C. 154(b) by 0 days.

(21) Appl. No.: 09/363,295

(22) Filed: Jul. 28, 1999

(51) Int. Cl.$^7$ .................................................. H01L 21/302
(52) U.S. Cl. .......................... 438/690; 438/691; 438/692
(58) Field of Search ..................................... 438/689, 690, 438/691, 692

(56) References Cited

U.S. PATENT DOCUMENTS

| | | | |
|---|---|---|---|
| 3,951,728 | * | 4/1976 | Egashira et al. ..................... 156/600 |
| 5,071,776 | * | 12/1991 | Matsushita et al. .................. 437/10 |
| 5,320,706 | * | 6/1994 | Blackwell ............................ 156/636 |
| 5,340,435 | * | 8/1994 | Ito et al. ............................... 156/632 |
| 5,424,224 | * | 6/1995 | Allen et al. ........................... 437/10 |
| 5,800,725 | * | 9/1998 | Kato et al. ............................ 216/88 |

* cited by examiner

Primary Examiner—Benjamin L. Utech
Assistant Examiner—Vanessa Perez-Ramos
(74) Attorney, Agent, or Firm—The Kline Law Firm

(57) ABSTRACT

A process for backside chemical etching and polishing of substrates including the steps of protecting the front surface of the wafer, chemical etching, first dump rinse/spin dry, backside polishing, residue cleaning, second dump rinse/spin dry, and front surface protection removal. The process is generally intended to be used for semiconductor wafers, but it can also be used for processing other types of substrates such as GaAs, GaP, GaAlAs, GaAlP, ceramics, quartz, bonded silicon wafers, dielectric isolated wafers and substrates, etc.

14 Claims, 1 Drawing Sheet

Process Flow Chart for CEP Process

1. Apply Protective Means.
2. Chemical Etch.
3. First dump rinse/ spin dry.
4. Backside polish.
5. Removing residue.
6. Second dump rinse/ spin dry.
7. Remove protective means.

Process Flow Chart for CEP Process

BACKSIDE CHEMICAL ETCHING AND POLISHING

FIELD OF THE INVENTION

The present invention relates generally to silicon wafer processing techniques, and more particularly is a process for backside chemical etching and backside polishing of the wafers.

BACKGROUND OF THE INVENTION

Semiconductor wafer manufacturing technology utilizes very sophisticated wafer processing procedures and complicated manufacturing systems to produce semiconductor chips. Each and every wafer goes through several steps, such as resist spinning, etching, dielectric layer depositions, metal depositions, and different encapsulation layers. These process steps are performed one or more times to define and etch pre-designed patterns on the silicon wafers. The wafers are subjected to several high temperature processes varying from 400° C. to 1400° C. It is during these multiple processing and deposition processes involving layers of different types of metals and die-electric that a great deal of stress is built up in the layers on the wafer due to differences in coefficients of expansion of the individual layers that are in direct contact with each other.

The ever increasing demand for reduced product sizes and miniaturization of computers has forced semiconductor manufacturers to shrink all parts going into electronic products. Common examples are Laptop Computers, Notebook Computers, Mobile Telephones, etc. In order to manufacture these products, manufacturers have to make smaller displays and key boards, and to produce thinner PC Boards. Manufacturers must also reduce the thicknesses of assembled IC packages so that the satisfy miniaturization parameters.

In order to meet the challenges of Thin Small Outline Packages (TSOP), semiconductor manufacturers have been forced to reduce the thickness of silicon wafers before sawing and dicing operations. Historically, post clean room wafer processing was done by using a backside wafer preparation technique to provide a good electrical contact to the substrate. After being processed through multiple oxidations and diffusions, the backside surface of the wafer was uncharacterized and unpredictable. A means of removing approximately 10–30 microns of material from the back of wafer was necessary.

Several methods have been used in the prior art to prepare the backside of the wafer for packaging. The dirtiest and probably the harshest process to clean the backside of silicon wafers was sand blasting. The same method used to clean building walls was used to clean silicon wafers. Cleaner technologies were developed by many device fabrication facilities that employed resist and plasma technologies. Some of these facilities tried chemical etching with a mixture of nitric acids, hydrofluoric acids, and acetic acids. All of these etching methods proved to be slow and not suitable for production mode. Moreover, the etching processes did not prove to be adding any significant advantages to the wafer, such as improving wafer strength, die strength, and electrical yields. It was not until a new market began to emerge that backgrind processing technology received industry attention. That new market was laptop computers.

Laptop computer technologies effectively pushed device-packaging technology users to meet a new set of dimensional demands. It has been posited by many market research analysts that in the future, integrated circuit manufacturers will be forced to employ higher and higher levels of multi-chip integration in order to maintain a profitable level of value added. It seems obvious that every part intended for a thin package will have to be reduced in thickness in order to accommodate the future multi-chip package schemes. The only viable alternative is therefore to backgrind each individual wafer after clean room processing.

The Backgrind Process

The first step in the backgrind process involves the application of a protective tape to protect the front side of the wafer. Several manufacturers such as Mitsui, Nitto Dhenko, Furukawa, Marubeni, and the like manufacture these tapes. These tapes are made of different types of base films coated with adhesives. Some of the adhesives are UV types and some are Non-UV types. Tape application machines are manufactured and sold by several companies such as Takatori, Nitto, Advantec, and the like.

Following application of the protective tape, the taped wafers are loaded onto wafer grinding systems. Fully automatic wafer grinding systems are manufactured by R. Howard Strasbaugh, Disco, Okamoto, and the like. These systems utilize sophisticated materials and mechanics to provide aggressive and uniform silicon removal. After the correct amount of material is removed from the back of the wafer, the tape is removed either manually or with an automatic tape removal system, and the wafers are cleaned.

When a wafer arrives in a backgrind process bay there exists a net cumulative film stress resulting from the thermal process stress induced during the manufacturing steps. The wafer is then thinned by the backgrind process. The stress resulting from the wafer grinding process adds to the thermal process stress already in the wafer. The cumulative stress built into the wafer leads to decreased wafer strength, subjecting the wafer to die cracking and other stress related failures in IC Packages, and more importantly, electrical failures of IC packages at Final Test. Grinding wafers with diamond wheels inevitably leaves flaws on the wafer back surface. These flaws, inclusions, often weaken both the wafer and the individual die after the wafers are sawed. Under thermal and mechanical stresses during packaging of IC's these inclusions can spread into active regions. Ultimately they may crack the entire die.

Accordingly, it is an object of the present invention to provide a process that reduces mechanical stress induced during the processing of wafers. This improves the mechanical strength of the full size silicon wafer, the electrical yields of the finished wafer at the wafer sort level, and reduces die cracking of the products in packages, thereby improving final test yields of the finished products after assembly and packaging.

It is a further object of the present invention to provide a process that removes microcracks within the wafer caused by wafer grinding.

SUMMARY OF THE INVENTION

The present invention is a process for backside chemical etching and polishing of substrates. The process comprises the steps of protecting the front surface of the wafer, chemical etching, first dump rinse/spin dry, backside polishing, residue cleaning, second dump rinse/spin dry, and front surface protection removal. The process is generally intended to be used for semiconductor wafers, but it can also be used for processing other types of substrates such as GaAs, GaP, GaAlAs, GaAlP, ceramics, quartz, bonded silicon wafers, dielectric isolated wafers and substrates, etc.

An advantage of the present invention is that it reduces stress forces applied to the wafer during manufacturing.

Another advantage of the present invention is that it removes the microcracks caused during the wafer grinding process.

A still further advantage of the present invention is that it can be used on many different types of substrates.

These and other objects and advantages of the present invention will become apparent to those skilled in the art in view of the description of the best presently known mode of carrying out the invention as described herein and as illustrated in the drawings.

DETAILED DESCRIPTION OF THE INVENTION

Figure 1:
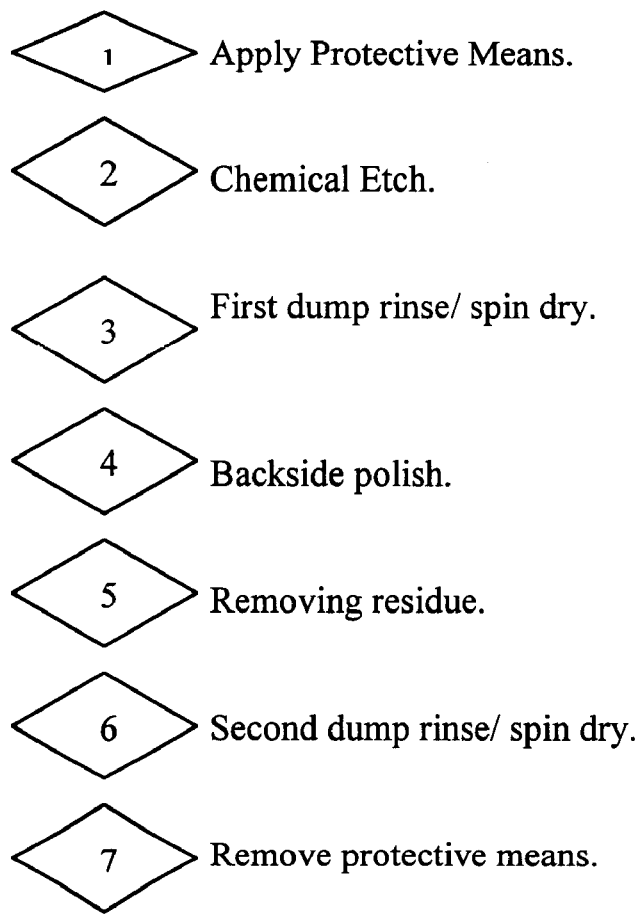
FIG. 1 is a flow chart of the process of the present invention.

The present invention is a process for backside chemical etching and polishing of substrates. While the process may be used on various types of substrates, for purposes of this description, it will be assumed that the substrates to be processed are semiconductor wafers with live circuits defined on a front side thereof. The semiconductor wafers are received after they have been processed in a clean room environment.

The process of the present invention involves the following steps:

A. Wafer Front Surface Protection. In order to protect the live circuit, a plastic tape with a pre-coated adhesive is used to cover the front side of the wafer. Instead of plastic tape, a protective overcoat can also be used. Suitable materials for this procedure are positive or negative photoresist, dyed or undyed photoresist, UV sensitive or non-UV sensitive photoresist, polyamide coating materials, bees wax, water soluble or solvent soluble wax, commercially available wafer grinding tapes, and the like. All of the above front surface protection means can be applied either by direct application to the wafer surface, by dip coating, or by spin coating. The front surface protection step must be utilized in order to apply the process of the present invention to the wafer.

B. Wafer Grinding. The wafers are then subjected to a grinding process to remove bulk from the substrate material. Grinding systems are known in the art, and are thus not described in detail herein. There are many companies that manufacture commercially available grinding systems. Some of the grinders are down-feed and some are creep-feed systems. Both of these processes remove the bulk of the substrate material very quickly.

C. Chemical Etch. After finishing the grinding process, the wafers or substrates are then subjected to chemical etchants of different formulations. These etchants are commercially available from many manufacturers. The etchants comprise different formulae, such as 5:1:1 or 6:1:1 mixtures of nitric acid, hydrofluoric acid, and acetic acid. A specific etchant found to be particularly effective in the development of this process was KOH (potassium hydroxide). The etchant may be 100% KOH, or the KOH can be diluted with DI water. The ratio of KOH to DI water should be at least 1:1 (one part KOH to one part DI water). The wafers, still with their front surfaces protected, are dipped in the etchant solution for 5 min. to 60 min. at room temperature, depending on the particular etchant used and the properties of the wafer.

D. Dump Rinse/Spin Dry. The wafers are then dumped rinsed with DI Water for 5 min. to 15 min. and then spin dried.

E. Backside Polishing. The wafers are then subjected to a backside polishing process. The polishing is continued until any grinding pattern is removed or until a specified thickness of the silicon wafer or other substrate material has been removed. The polishing process utilizes an abrasive media called slurry. Wafers can be polished one at a time or in a batch process. The loading method and number of wafers per batch is dependent on the wafer handling system used and varies from system to system.

Typically, to secure the wafers for the backside polishing process, the wafers are held in a template which is mounted on a carrier. In some cases the wafers are held on a block with wax. Wax is applied to the base plate at an elevated temperature, the wafers are placed face down on the block, a clean paper is placed on the front of the wafer to protect the live circuit, the block is cooled down to solidify the wax, which holds the wafers in place. Many other means of securing the wafers in position for the backside polishing process can be employed.

F. Residue Cleaning. The wafers are then subjected to a cleaning process to remove excess slurry or residues from the back surface of the wafer that remains following the backside polishing. Again, many cleaning processes may be utilized. Some suitable cleaning processes include DI water scrubbing, DI water ultrasonic or megasonic cleaning, TCA cleaning or cleaning with compatible solvents. Wafers can also be subjected to SCI ($NH_4OH:H_2O_2$) clean either at room temperature or at an elevated temperature, and for 5–60 min.

G. Second dump rinse/spin dry. When the residue from the wafers has been removed by a cleaning process, the wafers are again DI water dump rinsed and spin dried.

H. Front Surface Protection Removal. Following the second rinse/spin, the front surface protection means is removed. This process may be accomplished using either a UV curable exposure system, or by subjecting the wafers to photoresist stripping solutions or TCA and equivalent chemicals are used to do a final clean. Equipment used in this cleaning process can vary from wet benches to megasonic cleaning systems.

The process of the present invention can be set up to encompass whatever degree of automation is desired by the user. Using known automated wafer handling equipment, the process can be easily initiated as a completely automatic system to decrease wafer handling. If the user so desires, the handling process may also be established as a semi-automatic process or a completely manual process.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

I claim:

1. A process for reducing stresses in wafers utilizing backside chemical etching and backside polishing comprising:
   a) applying a protective means to a front surface of a wafer, said wafer having been processed such that a front surface of said wafer comprises a plurality of defined chips, each of said chips comprising live circuits defined thereon,
   b) chemical etching a backside of the wafer,
   c) subjecting the wafer to a first dump rinse/spin dry operation,
   d) backside polishing the wafer, e) removing residue generated during the backside polishing operation from the wafer, f) subjecting the wafer to a second dump rinse/spin dry operation, and g) removing said protective means from the front surface of the wafer.

2. The process defined in claim 1 wherein:

said protective means comprises photoresist, polyamide coating materials, wax, or wafer grinding tape.

3. The process defined in claim 1 wherein:

an etchant utilized in said chemical etching process step comprises a mixture of nitric acid, hydrofluoric acid, and acetic acid.

4. The process defined in claim 1 wherein:

an etchant utilized in said chemical etching process step comprises potassium hydroxide.

5. The process defined in claim 1 wherein:

the wafer is exposed to an etchant in the chemical etching process for 5 minutes to 60 minutes.

6. The process defined in claim 1 wherein:

said removing residue generated during the backside polishing operation process step comprises DI water scrubbing, DI water ultrasonic or megasonic cleaning, TCA cleaning, solvent cleaning, or SCI ($NH_4OH:H_2O_2$) cleaning.

7. A process for reducing stresses in wafers comprising:

a) applying a protective means to a front surface of a wafer, said wafer having been processed such that a front surface of said wafer comprises a plurality of defined chips, each of said chips comprising live circuits defined thereon, b) chemical etching a backside of the wafer, c) subjecting the wafer to a first dump rinse/spin dry operation, and d) removing said protective means from the front surface of the wafer.

8. The process defined in claim 7 wherein:

said protective means comprises photoresist, polyamide coating materials, wax, or wafer grinding tape.

9. The process defined in claim 7 wherein:

an etchant utilized in said chemical etching process step comprises a mixture of nitric acid, hydrofluoric acid, and acetic acid.

10. The process defined in claim 7 wherein:

an etchant utilized in said chemical etching process step comprises potassium hydroxide.

11. The process defined in claim 7 wherein:

the wafer is exposed to an etchant in the chemical etching process for 5 minutes to 60 minutes.

12. A process for reducing stresses in wafers comprising:

a) applying a protective means to a front surface of a wafer, said wafer having been processed such that a front surface of said wafer comprises a plurality of defined chips, each of said chips comprising live circuits defined thereon, b) backside polishing the wafer, c) removing residue generated during the backside polishing operation from the wafer, d) subjecting the wafer to a dump rinse/spin dry operation, and e) removing said protective means from the front surface of the wafer.

13. The process defined in claim 12 wherein:

said protective means comprises photoresist, polyamide coating materials, wax, or wafer grinding tape.

14. The process defined in claim 12 wherein:

said removing residue generated during the backside polishing operation process step comprises DI water scrubbing, DI water ultrasonic or megasonic cleaning, TCA cleaning, solvent cleaning, or SCI ($NH_4OH:H_2O_2$) cleaning.

* * * * *